United States Patent
Tanaka (10) Patent No.: US 10,938,376 B2
(45) Date of Patent: Mar. 2, 2021

(54) ACOUSTIC WAVE DEVICE

(71) Applicant: KYOCERA Corporation, Kyoto (JP)

(72) Inventor: Hiroyuki Tanaka, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 6 days.

(21) Appl. No.: 16/340,012

(22) PCT Filed: Oct. 10, 2017

(86) PCT No.: PCT/JP2017/036615
§ 371 (c)(1),
(2) Date: Apr. 5, 2019

(87) PCT Pub. No.: WO2018/070369
PCT Pub. Date: Apr. 19, 2018

(65) Prior Publication Data
US 2020/0036360 A1  Jan. 30, 2020

(30) Foreign Application Priority Data

Oct. 11, 2016 (JP) .................... 2016-199995

(51) Int. Cl.
*H03H 9/145* (2006.01)
*H03H 9/15* (2006.01)
*H03H 9/64* (2006.01)

(52) U.S. Cl.
CPC ............. *H03H 9/145* (2013.01); *H03H 9/15* (2013.01); *H03H 9/64* (2013.01)

(58) Field of Classification Search
CPC ................. H03H 9/145–15; H03H 9/54–76
See application file for complete search history.

(56) References Cited

U.S. PATENT DOCUMENTS

| | | | | |
|---|---|---|---|---|
| 6,377,138 B1* | 4/2002 | Takagi | ............ | H03H 3/08 310/313 B |
| 6,516,503 B1* | 2/2003 | Ikada | ............ | H03H 3/08 216/79 |
| 7,692,515 B2* | 4/2010 | Hauser | ............ | H03H 9/6423 333/133 |
| 8,564,172 B2* | 10/2013 | Seki | ............ | H03H 9/02842 310/313 A |
| 9,438,201 B2* | 9/2016 | Hori | ............ | H03H 9/02228 |
| 9,819,329 B2* | 11/2017 | Tsurunari | ............ | H03H 9/725 |

(Continued)

FOREIGN PATENT DOCUMENTS

| | | |
|---|---|---|
| JP | 2007-214902 A | 8/2007 |
| JP | 2008-508821 A | 3/2008 |

(Continued)

*Primary Examiner* — Dean O Takaoka
*Assistant Examiner* — Alan Wong
(74) *Attorney, Agent, or Firm* — Procopio Cory Hargreaves and Savitch LLP (57) ABSTRACT

An acoustic wave device 1 includes a piezoelectric substrate 2 including a first surface 2A and a second surface 2B, a support substrate 6 bonded to the second surface 2B of the piezoelectric substrate 2, and a first filter 10a and a second filter 10b a passband of which is higher than that of the first filter, both being on the first surface 2A of the piezoelectric substrate 2. The first filter 10a and the second filter 10b each includes an IDT electrode 3. A thickness of the IDT electrode 3 of the first filter 10a and a thickness of the IDT electrode 3 of second filter 10b are different.

6 Claims, 6 Drawing Sheets

(56) References Cited

U.S. PATENT DOCUMENTS

| | | | |
|---|---|---|---|
| 10,270,421 B2 * | 4/2019 | Kawasaki | H03H 9/25 |
| 2007/0241841 A1 | 10/2007 | Hauser et al. | |
| 2018/0287586 A1 * | 10/2018 | Daimon | H03H 9/25 |

FOREIGN PATENT DOCUMENTS

| | | |
|---|---|---|
| JP | 2010-103920 A | 5/2010 |
| WO | 2016/129662 A1 | 8/2016 |

\* cited by examiner

ACOUSTIC WAVE DEVICE

TECHNICAL FIELD

The present invention relates to an acoustic wave device.

BACKGROUND ART

There is known a SAW (surface acoustic wave) element having a piezoelectric substrate and an IDT (interdigital transducer) provided on a major surface of the piezoelectric substrate (for example Japanese Patent Publication No. 2007-214902A). Such a SAW element is for example utilized for a receiving filter or transmission filter in a duplexer. Above Literature does not use a solo piezoelectric substrate in a SAW element, but uses a bonded substrate comprised of a piezoelectric substrate and a support substrate having a smaller thermal expansion coefficient compared with the piezoelectric substrate bonded to each other in a SAW element. By utilizing such a bonded substrate, for example, a temperature change of electrical characteristics of the SAW element is compensated for.

SUMMARY OF INVENTION

Technical Problem

However, if use is made of a bonded substrate as explained above, in the electrical characteristics of a SAW element, sometimes a spurious emission, which is not generated when a bonded substrate is not used, is generated. Accordingly, desirably a surface acoustic wave device capable of reducing such a spurious emission is provided.

Solution to Problem

An acoustic wave device according to one aspect of the present disclosure includes a piezoelectric substrate including a first surface and a second surface, a support substrate bonded to the second surface, and a first filter and a second filter on the first surface.

A passband of the second filter is higher than that of the first filter.

The first filter includes at least one first IDT electrode, the second filter includes at least one second IDT electrode, and a thickness of the first IDT electrode and a thickness of the second IDT electrode are different from each other.

Advantageous Effect of Invention

The acoustic wave device according to one aspect of the present disclosure explained above becomes reduced in spurious emission.

DESCRIPTION OF EMBODIMENTS

Below, embodiments according to an acoustic wave device of the present disclosure will be explained in detail by using the drawings. Note that, the drawings used in the following explanation are schematic ones. Size ratios etc. in the drawings do not always coincide with the actual ones.

Further, in the explanations of modifications etc., the configurations which are the same as or similar to the configurations in the already explained embodiments will sometimes be assigned the same notations as those in the already explained embodiments and explanations will be omitted. Further, for components having similar fundamental configurations, sometimes the descriptions of "first", "second", etc. will be omitted and explanations will be given without differentiating among them.

In the acoustic wave device, any direction may be defined as "above" or "below". In the following description, however, for convenience, a D1 direction, D2 direction, and D3 direction which are perpendicular to each other will be defined, and the "upper surface", "lower surface", and other terms will be used where the positive side of the D3 direction is the upper part. Note that, an orthogonal coordinate system defined by the D1 direction, D2 direction, and D3 direction explained above is defined based on the shape of the acoustic wave device, but does not designate crystal axes (X-axis, Y-axis, and Z-axis) of a piezoelectric crystal configuring the piezoelectric substrate.

<Acoustic Wave Device>

Figure 1:
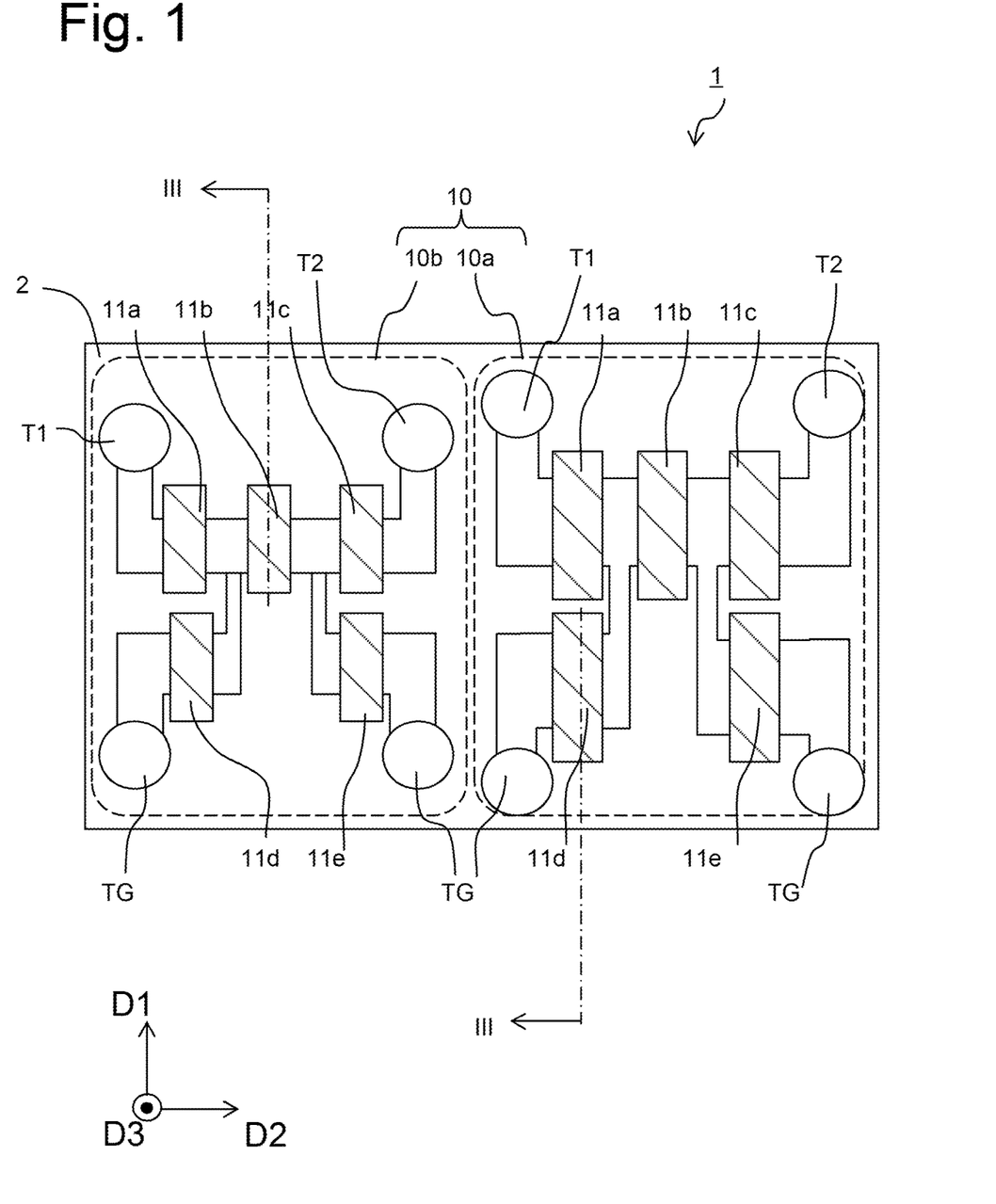
FIG. 1 is a plan view showing an embodiment of an acoustic wave device according to the present disclosure.
Figure 2:
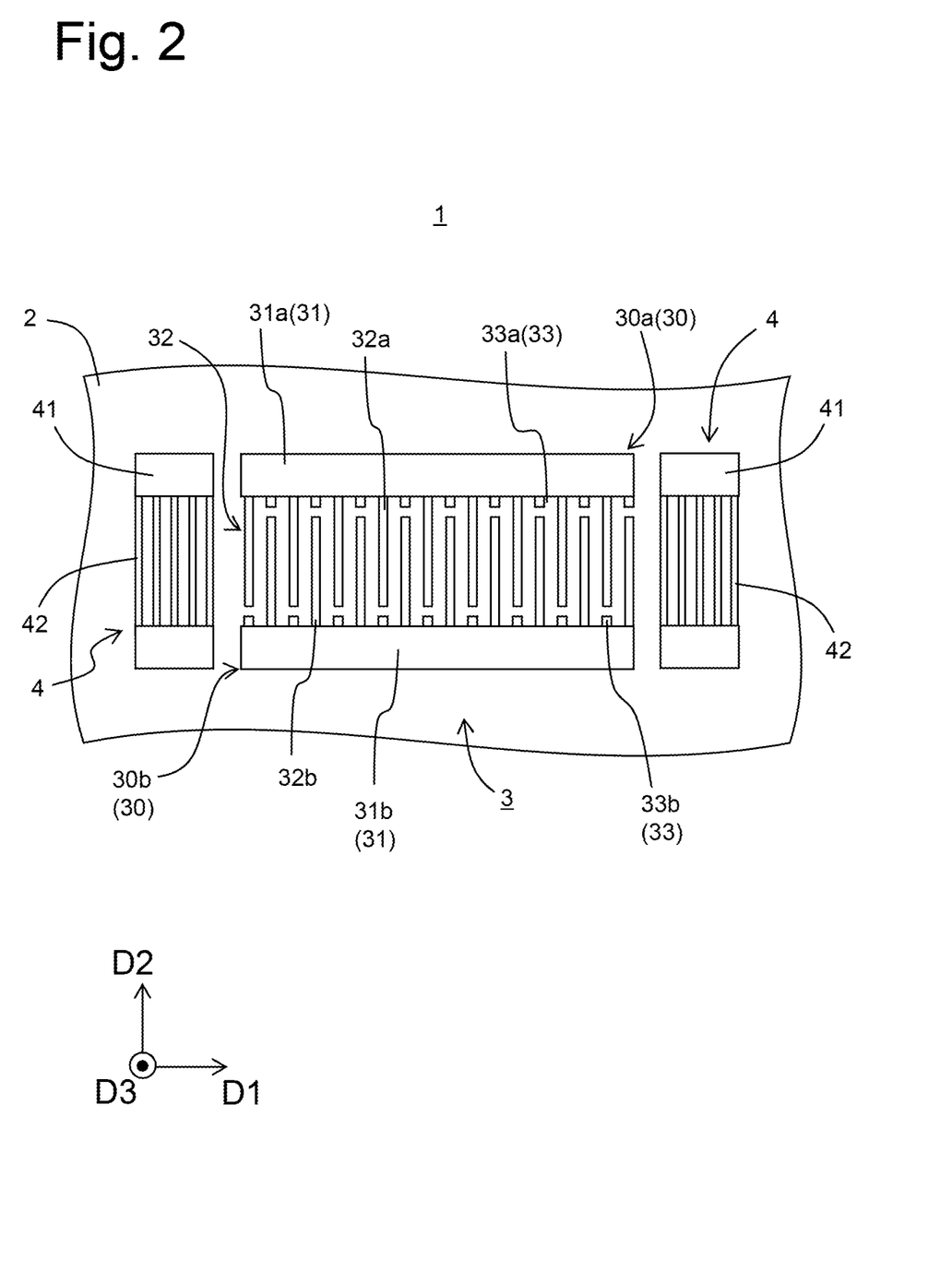
FIG. 2 is a plan view of an enlarged principal part showing the configuration of an IDT electrode included in the acoustic wave device shown in FIG. 1.
Figure 3:
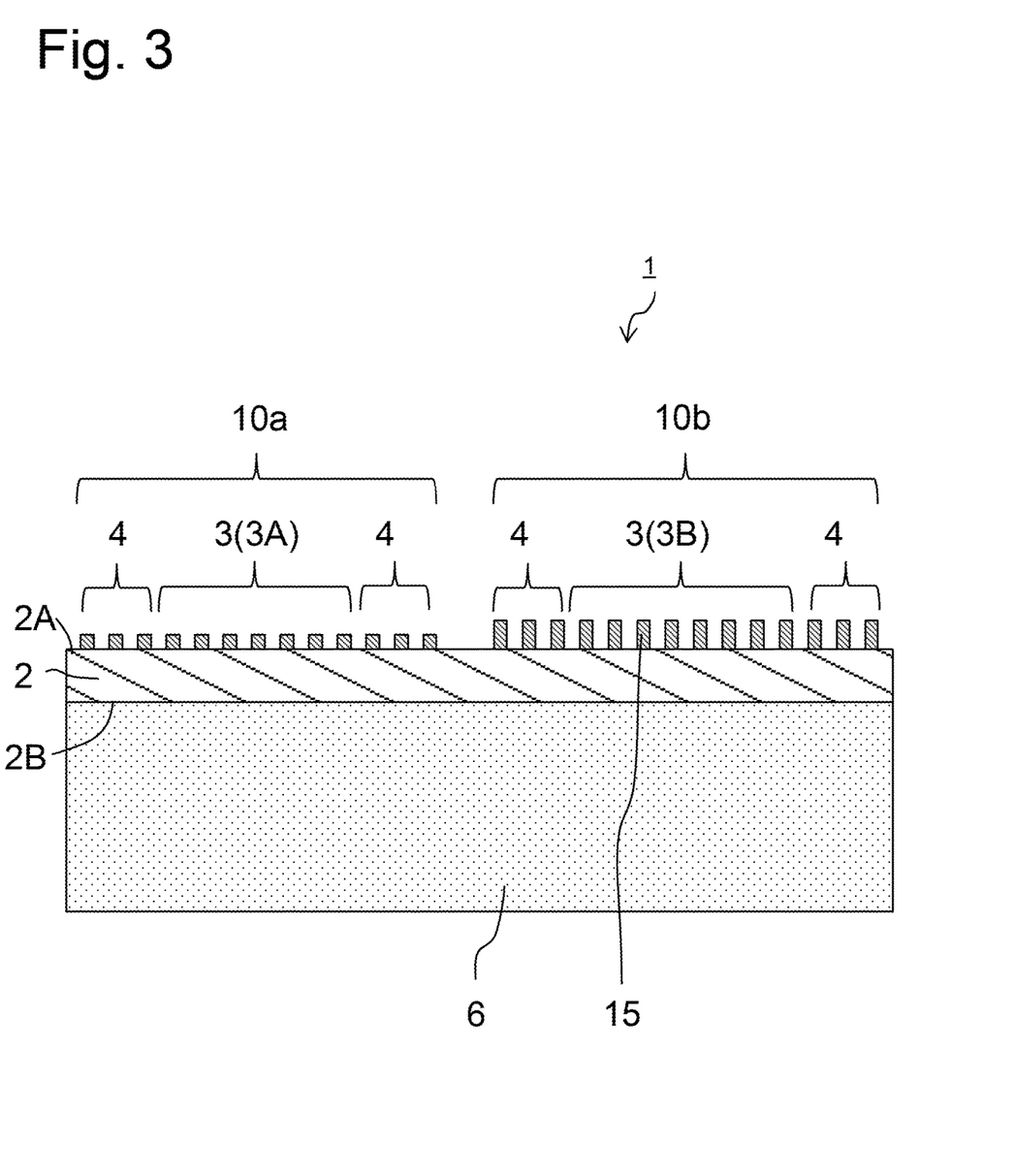
FIG. 3 is a cross-sectional view taken along the line in FIG. 1.

FIG. 1 is a plan view of an acoustic wave device 1 according to an embodiment of the present disclosure, FIG. 2 is a plan view showing the configuration of an IDT electrode 3, and FIG. 3 is a perspective cross-sectional view taken along the line in FIG. 1.

The acoustic wave device 1 has a piezoelectric substrate 2 configured by a piezoelectric crystal, a support substrate 6, and a first filter 10*a* and second filter 10*b*.

The piezoelectric substrate 2 is configured by a single crystal having a piezoelectric characteristic (piezoelectric crystal) comprised of an LN (lithium niobate: $LiNbO_3$) crystal or LT (lithium tantalate: $LiTaO_3$) crystal. Specifically, for example, the piezoelectric substrate 2 is configured by a 36° to 48° Y-X cut LT substrate. The planar shape and various dimensions of the piezoelectric substrate 2 may be suitably set. As an example, the thickness (D3 direction) of the piezoelectric substrate 2 is 1 μm to 30 μm.

The piezoelectric crystal of the piezoelectric substrate 2 has the XYZ axes as the crystal axes. Where use is made of an X-propagated substrate, the X-axis and the D1 direction coincide. That is, the X-axis and the D1 direction become the direction of propagation of the acoustic wave. Further, the Y-axis and Z-axis are not provided with a component of the D1 direction, but are provided with components of the D2 direction and D3 direction.

Such a piezoelectric substrate 2 is provided with a first surface 2A and second surface 2B perpendicular to the D3 direction. On the second surface (lower surface) 2B of the piezoelectric substrate 2, a support substrate 6 is arranged. These piezoelectric substrate 2 and support substrate 6 together configure an element substrate.

The support substrate 6 is not particularly limited so far as it has a strength strong enough to support a thin piezoelectric substrate 2. However, it is formed by for example a material having a smaller thermal expansion coefficient than that of the material for the piezoelectric substrate 2. According to the element substrate having such a configuration, thermal stress is generated in the piezoelectric substrate 2 when the temperature changes. At this time, the temperature dependency and the stress dependency of the elastic constant are cancelled out by each other and consequently the change of the electrical characteristics of the acoustic wave device 1 due to temperature is compensated for. As such a material, for example, there can be mentioned sapphire or another single crystal, silicon or another semiconductor, an aluminum oxide sintered body or other ceramic, a quartz crystal, and the like. Note that, the support substrate 6 may be configured by stacking a plurality of layers which are made of materials different from each other.

The thickness of the support substrate 6 is for example constant. The thickness may be suitably set in the same way as the thickness of the piezoelectric substrate 2. For example, the thickness of the support substrate 6 is set considering the thickness of the piezoelectric substrate 2 so that temperature compensation is suitably carried out. As an example, for a thickness of the piezoelectric substrate 2 of 1 to 30 μm, the thickness of the support substrate 6 is 75 to 300 μm.

The piezoelectric substrate 2 and the support substrate 6 are bonded to each other through a not shown bonding layer. The material of the bonding layer may be an organic material or inorganic material. As an organic material, for example there can be mentioned a thermosetting resin or other resin. As an inorganic material, for example there can be mentioned $SiO_2$. Further, the two substrates may be bonded by so-called direct bonding of activating the bonding surfaces by plasma, an ion gun, neutron gun, or the like, then bonding the bonding surfaces to each other without a bonding layer.

On the first surface (upper surface) 2A of the piezoelectric substrate 2, a first filter 10a, and a second filter 10b having a different passband from the first filter 10a are positioned. Each of the first filter 10a and second filter 10b is configured by an electrode group including IDT electrodes 3. More specifically, the first filter 10a includes at least one first IDT electrode 3A, and the second filter 10b includes at least one second IDT electrode 3B. As will be explained later, the first IDT electrode 3A and the second IDT electrode 3B are the same in their fundamental structures. Therefore, when explaining the common parts, they will be explained as the IDT electrodes 3 without differentiating the two.

Further, in this example, each of the first filter 10a and second filter 10b is provided with a plurality of resonators 11 (11a to 11e) each including an IDT electrode 3. They are connected to each other to configure a ladder-type filter.

Here, the IDT electrode 3 configuring a portion of the resonator 11 will be explained with reference to FIG. 2. The IDT electrode 3, as shown in FIG. 2, has a first comb-shaped electrode 30a and second comb-shaped electrode 30b. Note that, in the following explanation, sometimes the first comb-shaped electrode 30a and second comb-shaped electrode 30b will be simply referred to as the "comb-shaped electrodes 30" and the two will not be differentiated.

The comb-shaped electrodes 30, as shown in FIG. 2, have two bus bars 31 (first bus bar 31a, second bus bar 31b) facing each other and pluralities of electrode fingers 32 (first electrode fingers 32a, second electrode fingers 32b) which extend from each bus bar 31 toward the other bus bar 31 side. Further, the pair of comb-shaped electrodes 30 are arranged so that the first electrode fingers 32a and the second electrode finger 32b intermesh (intersect) with each other in the direction of propagation of the acoustic wave. The first bus bar 31a and the second bus bar 31b are connected to potentials which are different from each other.

Further, the comb-shaped electrodes 30 have dummy electrode fingers 33 respectively facing the electrode fingers 32 on the other side. The first dummy electrode fingers 33a extend from the first bus bar 31a toward the second electrode fingers 32b. The second dummy electrode fingers 33b extend from the second bus bar 31b toward the first electrode fingers 32a.

The pluralities of electrode fingers 32 in the pair of comb-shaped electrodes 30 configuring the IDT electrode 3 are set so as to have a pitch Pt1. The pitch Pt1 is for example provided so as to become equal to a half wavelength of the wavelength λ of the acoustic wave at the frequency at which resonation is desired to be caused. The wavelength λ (that is 2×Pt1) is for example 1.4 μm to 6 μm. In the IDT electrode 3, by arranging most of the plurality of electrode fingers 32 to have the pitch Pt1, the plurality of electrode fingers 32 are arranged by a constant period, therefore the acoustic wave can be efficiently generated.

Here, the "pitch Pt1" designates, in the direction of propagation (D1 direction, X-direction), the interval from the center of a first electrode finger 32a to the center of a second electrode finger 32b which is adjacent to this first electrode finger 32a.

By arranging the electrode fingers 32 in this way, an acoustic wave propagating in the direction perpendicular to the plurality of electrode fingers 32 is generated.

The IDT electrode 3 is for example configured by a metal conductive layer 15. As this metal, for example there can be mentioned Al or an alloy containing Al as the principal ingredient (Al alloy), an alloy containing Cu, Mg etc., and a combination of them. The Al alloy is for example an Al—Cu alloy. Note that, the IDT electrode 3 may be configured by a plurality of metal layers as well. The various dimensions of the IDT electrode 3 are suitably set in accordance with the electrical characteristics etc. demanded from the SAW element 1. The thickness (D3 direction) of the IDT electrode 3 will be explained later.

The IDT electrode 3 may be directly arranged on the first surface 2A of the piezoelectric substrate 2 or may be arranged on the first surface 2A of the piezoelectric substrate 2 through an underlying layer configured by another member. The other member is for example configured by Ti, Cr, or an alloy of them or the like. When the IDT electrode 3 is arranged on the upper surface 2A of the piezoelectric substrate 2 through an underlying layer, the thickness of the other member is set to an extent where almost no influence is exerted upon the electrical characteristics of the IDT electrode 3 (for example the thickness of 5% of the thickness of the IDT electrode 3 in the case of Ti).

Further, on the electrode fingers 32 configuring the IDT electrode 3, a mass-addition film may be laminated in order to improve the temperature characteristic of the SAW element 1. As the mass-addition film, for example $SiO_2$ can be used.

When a voltage is supplied, the IDT electrode 3 excites an acoustic wave propagating in the D1 direction in the vicinity of the upper surface 2A of the piezoelectric substrate 2. The excited acoustic wave is reflected at a boundary with a region where electrode fingers 32 are not arranged (long shaped region between the adjacent electrode fingers 32). Then, a standing wave having the pitch Pt1 of the electrode fingers 32 as a half wavelength is formed. The standing wave is converted to an electrical signal having the same frequency as that of the standing wave and is extracted by the electrode fingers 32.

The reflectors 4 are arranged so as to sandwich the IDT electrode 3 in the direction of propagation of the acoustic wave. The reflectors 4 are substantially formed in slit shapes. That is, the reflectors 4 have reflector bus bars 41 which face each other in a direction crossing the direction of propagation of the acoustic wave and pluralities of reflection electrode fingers 42 which extend between these bus bars 41 in a direction perpendicular to the direction of propagation of the acoustic wave. The reflector bus bars 41 are for example substantially formed in long shapes so as to linearly extend with constant widths and are arranged parallel to the direction of propagation of the acoustic wave.

A not shown protective layer is provided on the piezoelectric substrate 2 so as to cover the IDT electrode 3 and reflectors 4. The protective layer is made of a material having an insulation property. For example, it is formed by $SiO_2$ or another material.

Here, a bulk wave spurious emission frequency in the acoustic wave device 1 will be studied.

When a voltage is supplied to the piezoelectric substrate 2 by the IDT electrodes 3, two or more types of bulk waves among which at least either the modes of vibration direction or modes of degree are different from each other are generated. The modes of vibration direction are for example a mode of vibration in the D3 axis direction, a mode of vibration in the D2 axis direction, and a mode of vibration in the D1 axis direction. Each of the modes of vibration direction has a plurality of modes of degree. These modes of degree are for example defined according to the numbers of nodes and anti-nodes in the depth direction (D3 axis direction). Note that, the emission frequency of the bulk wave spurious emission is determined by the pitch of the IDT electrodes 3 and the thickness of the piezoelectric substrate 2.

Therefore, the inventors assumed a plurality of acoustic wave devices 1 different from each other in thicknesses is of the piezoelectric substrates 2 and investigated the influence of the thickness of the piezoelectric substrate 2 exerted upon the frequency of the bulk wave of each mode. Specifically, they used computational simulation to calculate the frequencies of the bulk waves of the modes generated in the piezoelectric substrates 2 having various thicknesses.

Figure 4:
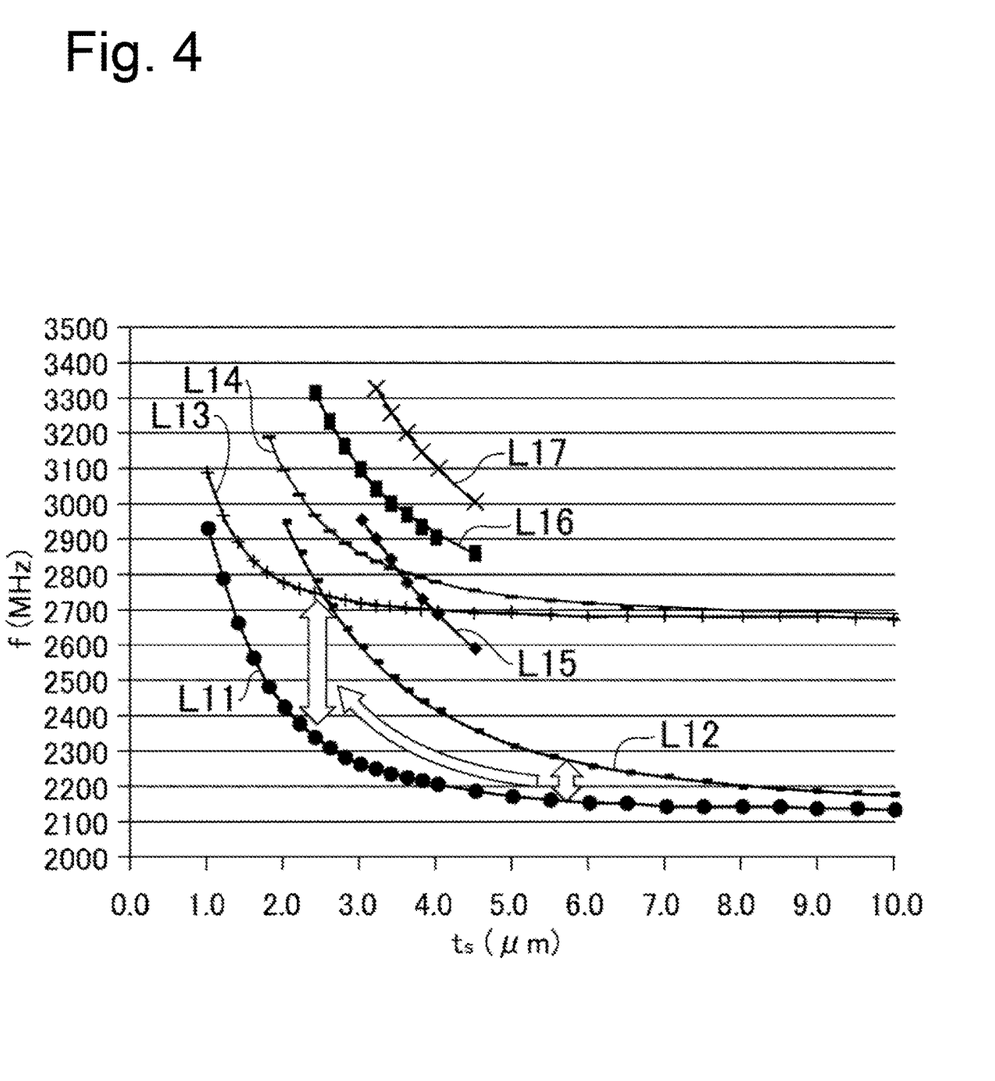
FIG. 4 is a graph showing a correlation of a thickness of a piezoelectric substrate and a frequency of bulk wave spurious emission.

FIG. 4 is a graph showing the results of computational simulation described above in a certain pitch.

In this graph, an abscissa (ts) shows the thicknesses of the piezoelectric substrates 2. An ordinate (f) shows frequencies of the bulk waves. A plurality of lines L11 to L17 indicate frequencies of two or more types of bulk waves in which at least either the modes of vibration direction or the modes of degree are different from each other.

Note that, in this graph, the lines L15, L16, and L17 were plotted up to the middle. In actuality, however, in the same way as the lines L11 to L14, lines indicating lowering of frequencies along with an increase of thicknesses continue. Further, although not shown, after the line L17 (lines L18, L19, . . . ), there are countless lines having the same tendency as L11 to L17. For this reason, bulk wave spurious emissions at a certain thickness are generated at frequencies where line segments parallel to the ordinate (f) cut across these lines (L11 to L19 etc.)

In a usual bonded substrate, it is often recommended to have a thickness of the piezoelectric substrate 2 of 20 μm. For this reason, in a usual bonded substrate, the frequency band used cuts across countlessly complicated lines (L11 to L17 etc.) on the side where the thickness is further thicker than those in the thickness range shown in FIG. 4. As a result, bulk wave spurious emissions are caused all over the frequency bands used.

As indicated by arrows in this graph, in the bulk waves in all modes, the smaller the thickness of the piezoelectric substrate 2, the higher the frequency. Further, also the frequency intervals among the bulk wave spurious emissions expand. In particular, in a region surrounded by the lines L11, L12, and L13, there is a region where no bulk wave spurious emission is caused in a relatively wide range. However, even in such a unique region, at the same thickness of the piezoelectric substrates 2, it is difficult to simultaneously avoid a bulk wave spurious emission of a desired frequency in both filters (10a, 10b) having different frequency bands.

Specifically, if the passbands are different, also pitches of the IDT electrodes 3 are different, therefore also the frequency of the bulk wave spurious emission shifts. For this reason, it is difficult to simultaneously avoid the bulk wave spurious emission in both of the two filters (10a, 10b) in a certain frequency band.

In order to cope with this, it was necessary to select a suitable thickness of the piezoelectric substrate 2 matching with each of the two filters (10a, 10b).

Contrarily to this, as a result of intensive studies by the inventors, the following fact was found: If the film thickness of the IDT electrode 3 was changed, the frequency characteristic of the surface acoustic wave (SAW) such as resonance frequency changed in accordance with that, but the frequency characteristic of the bulk wave spurious (BAW) emission did not change.

Figure 5:
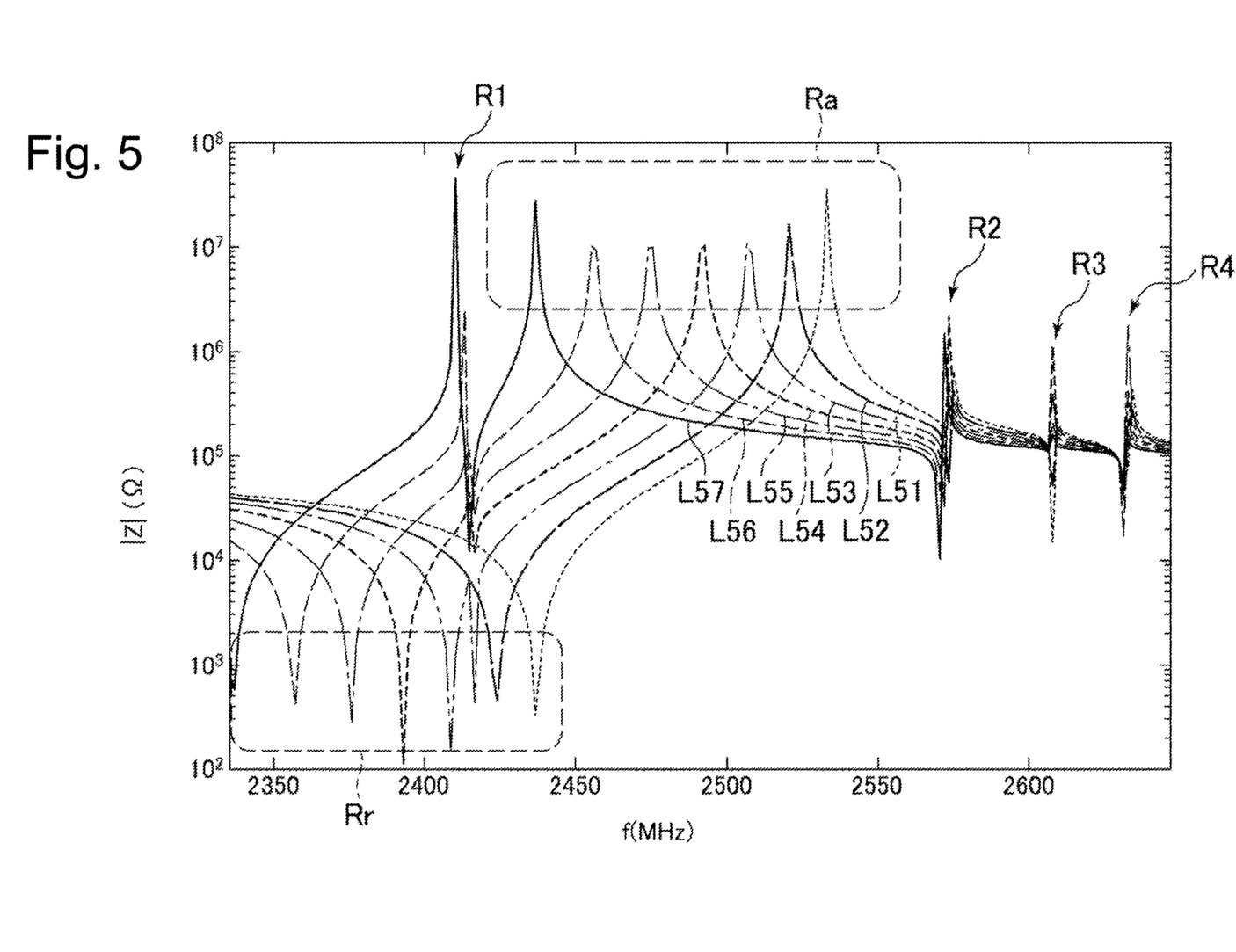
FIG. 5 is a graph showing a frequency characteristic when making the film thickness of the IDT electrode different.

FIG. 5 shows the frequency characteristics of the resonators when changing the film thicknesses of the IDT electrodes 3. The abscissa shows the frequencies, and the ordinate shows impedances. Lines L51 to L57 are lines showing the frequency characteristics when the thicknesses of the IDT electrodes when normalized by the wavelength of the acoustic wave were changed one by one by 0.06 in a range of 0.075 to 0.111. As surrounded by dotted lines, Rr indicates a region where resonance points appear and Ra indicates a region where anti-resonance points appear. R1 to R4 indicated by arrows indicate regions causing bulk wave spurious emissions.

As apparent also from FIG. 5, the resonance frequency fr and anti-resonance frequency fa shift in the frequencies by changing the film thickness. Specifically, if the film thickness is increased, the resonance frequency fr and anti-resonance frequency fa shift to a lower frequency side. On the other hand, it is seen that the frequency positions of the bulk wave spurious emissions do not shift.

This shows that FIG. 4 can be regarded to show the frequency characteristic of only bulk wave spurious emission. That is, as shown in this graph, when viewed at a certain thickness of the piezoelectric substrate 2, by changing the film thickness of the IDT electrode 3, the frequency position of the bulk wave spurious emission is maintained as it is, and while ranges of the resonance frequency fr and anti-resonance frequency fa which can be realized can be widened.

On the contrary, this graph shows that the frequency at which a bulk wave frequency emission is caused can be controlled according to the pitch of the IDT electrodes 3 while the resonation characteristic can be adjusted according to the film thickness so as to be a desired one.

Based on the above description, in the acoustic wave device 1, as shown in FIG. 3, the film thickness is made different between the first IDT electrode 3A configuring the first filter 10a and the second IDT electrode 3B configuring the second filter 10b so as not to cause a bulk wave spurious emission at the desired frequency.

Usually, for the film thickness of the IDT electrode 3, considering a propagation loss of the surface acoustic wave, the thickness normalized by the wavelength is determined to about 0.07. This is resulted in that the optimum electrode thickness differs in accordance with the frequency. However, where use is made of the bonded substrate, the influence of such a loss can be ignored. Therefore, usually the thickness need not to be made different. Under such a situation, in the present embodiment, the thickness of the IDT electrode 3 in at least one of the first filter 10a and second filter 10b is changed considering the bulk wave.

Note that, in order to make the thickness differ, the thickness of the conductive layer 15 may be made different or it may be made different by repeatedly stacking an underlying layer and a conductive layer 15. Further, the electrode thickness is made thick in an entire region of the resonator 11 (IDT electrode 3 and the reflectors 4 sandwiching it).

Due to this, even if the two filters 10a and 10b having quite different passbands are arranged on the substrate having the same thickness (same piezoelectric substrate 2), both of them can avoid a bulk wave spurious emission, so an acoustic wave device 1 excellent in the frequency characteristic can be provided.

Note that, the pitch of the IDT electrode 3 in the first filter 10a and the pitch of the IDT electrode 3 in the second filter 10b may be the same or may be different.

Where they are the same, the bulk wave spurious emission is caused at the same frequency in the two filters 10a and 10b, therefore the thickness of the piezoelectric substrate 2 and/or the pitch of the IDT electrodes 3 may be determined to such values that a bulk wave spurious emission is not caused at the desired frequency. Note that, in the example in FIG. 4, the frequencies of the resonance frequency fr and anti-resonance frequency fa could be shift by 100 MHz or more. Therefore, as understood, even the two filters 10a and 10b having the different passbands can be realized by the same pitch. Where the pitches of the IDT electrodes 3 are the same between the first filter 10a and the second filter 10b, a bulk wave spurious emission of the same mode is caused at the same frequency in the two filters, therefore designing becomes easy.

On the other hand, where the pitches are different, in the two filters 10a and 10b, the pitches of the IDT electrodes 3 may be respectively determined to such values that a bulk wave spurious emission is not caused at desired frequencies, then the film thicknesses of the IDT electrodes 3 may be adjusted so as to obtain the desired frequency characteristics. According to such a configuration, the optimum design can be realized in the two of the filters 10a and 10b, so it is preferred.

Further, the filters 10 provided with different two passbands can be formed on the same piezoelectric substrate 2 in this way, therefore the acoustic wave device 1 can be small-sized compared with a case where they are provided on different substrates.

Other Embodiment

In the example explained above, the relationships between the latitudes of the passbands of the first filter 10a and second filter 10b, and the sizes of film thicknesses of the IDT electrodes 3 were not specified. However, the second filter 10b may be provided with a higher passband than the first filter 10a and the thickness of the IDT electrode 3 in the former may be made thicker compared with the first filter 10a.

In general, the pass-band widths of the first filter 10a and the second filter 10b are substantially the same. Further, where they are the ladder-type filters, the relationship of the pitch of the IDT electrodes 3 in each of the resonators 11a to 11e configuring the first filter 10a, and the relationship of the pitch of the IDT electrodes 3 in each of the resonators 11a to 11e configuring the second filter 10b are relatively closely resembled.

Here, where the film thicknesses of the IDT electrodes 3 in the first filter 10a and the second filter 10b are the same, at the thickness of the piezoelectric substrate 2 which is set so as to eliminate the influence by the bulk wave spurious emission at the first filter 10a, in the second filter 10b, a bulk wave spurious emission is caused on a relatively low frequency side. This is because the wavelength of SAW is shorter in the second filter 10b having a higher frequency, therefore the thickness of the piezoelectric substrate 2 for the wavelength becomes practically thicker in the second filter 10b than the first filter 10a, so the frequency of the bulk wave spurious emission in the waveform of the frequency characteristic of the second filter 10b shifts to a lower frequency side.

Figure 6A:
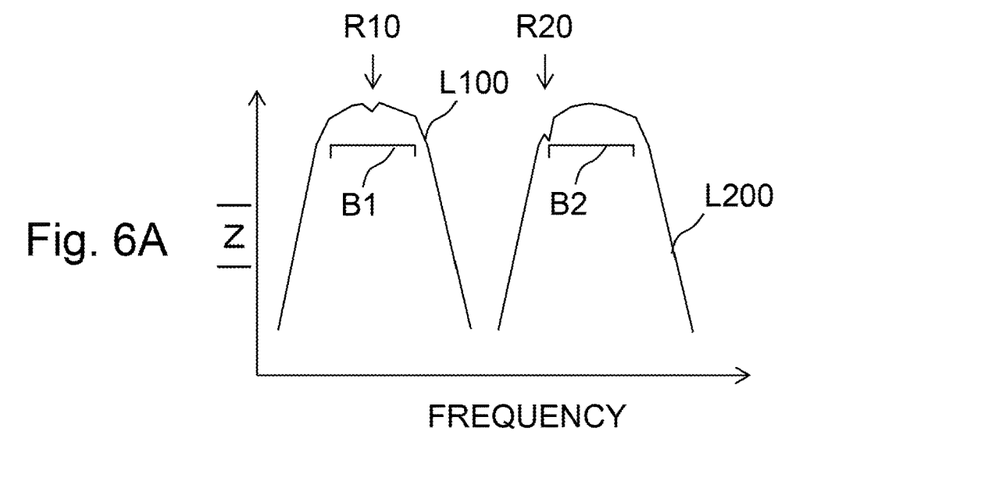
FIG. 6A to FIG. 6C are conceptual schemes showing a method for designing the IDT electrode in the acoustic wave device.
Figure 6B:
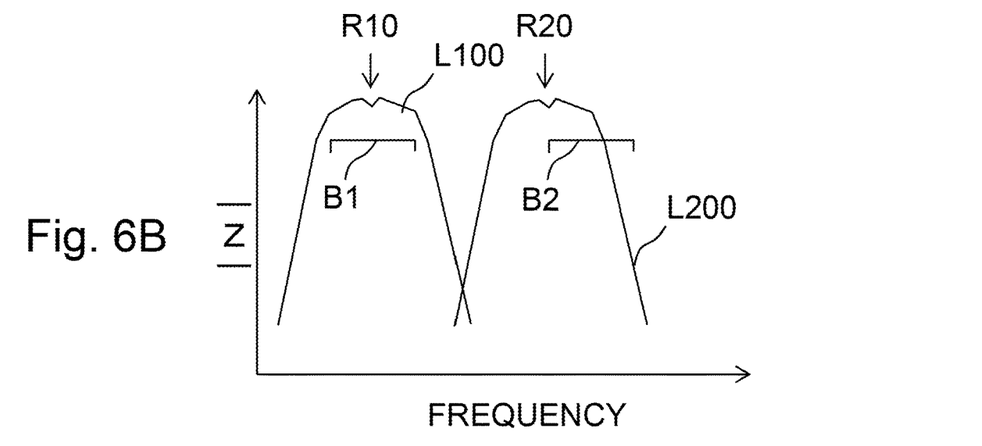
Figure 6C:
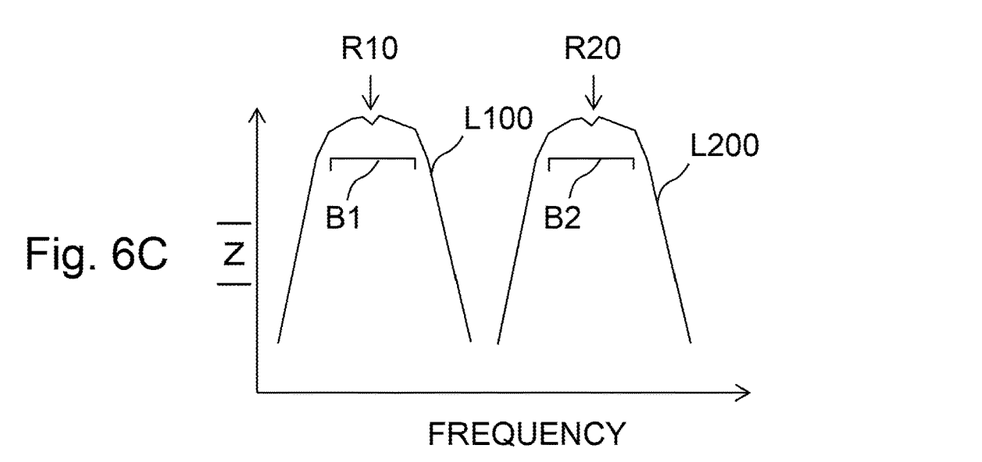

A method for controlling the bulk wave spurious emission with respect to this will be explained by using FIG. 6. In FIG. 6, the abscissas show the frequencies, and the ordinates show the impedances. A line L100 is a line indicating the frequency characteristic of the first filter 10a, and a line L200 is a line indicating the frequency characteristic of the second filter 10b. Further, R10 and R20 indicate the peaks of the bulk wave spurious emission. B1 and B2 respectively indicate the passbands of the first filter 10a and the second filter 10b.

FIG. 6A shows the frequency characteristics of the filters 10 before adjustment. As shown in FIG. 6A, in the first filter 10a, the thickness of the piezoelectric substrate 2 is selected so as to make the bulk wave spurious R10 positioned at the center of the passband B1. On the other hand, in the second filter 10b, the substrate thickness is not suitable for the second filter 10b, therefore the bulk wave spurious R20 becomes lower than that at the center of the passband B2, and is generated in a shoulder portion of the passband B2. In this case, the transmission characteristic of the filter ends up being remarkably deteriorated.

Therefore, in order to eliminate the influence of the bulk wave spurious emission also in the second filter 10b, the following technique will be taken. First, as shown in FIG. 6B, the film thickness of the IDT electrode 3 in the second filter 10b is increased. In that case, only the line L200 indicating the waveform of the second filter 10b shifts to a lower frequency side. However, the frequency of the bulk wave spurious R20 does not change. For this reason, the bulk wave spurious R20 can be positioned at the center of the line L200 of the second filter 10b.

Next, as shown in FIG. 6C, in order to return the waveform of the second filter 10b (line L200) to the desired frequency position of the passband B2, the pitch of the IDT electrode 3 is made smaller to shift the waveform to a higher frequency side. At that time, the position of the bulk wave spurious R20 ends up shifting to somewhat lower frequency side again by a worth of reduction of the pitch. However, the frequency movement amount of the waveform of the second filter 10b when making the film thickness of the IDT electrode 3 thicker is larger, therefore the influence becomes smaller.

In this way, even if the two filters 10a and 10b having quite different passbands are arranged on the substrate having the same thickness (same piezoelectric substrate 2), both of the two can avoid a bulk wave spurious emission, therefore the acoustic wave device 1 excellent in the frequency characteristics can be provided.

Note that, a case where the thickness of the piezoelectric substrate 2 is selected matching with the frequency on the second filter 10b side is resulted in that the thickness of the IDT electrode 3 in the first filter 10a is made thin by performing the same adjustment as that explained above. In any case, the film thickness of the IDT electrode 3 in the second filter 10b becomes thicker.

Further, the element size can be made smaller in the case of adjustment of the bulk wave spurious position by increasing the thickness of the IDT electrode 3 and making the pitch narrower than the case of adjustment of that by making the thickness of the IDT electrode 3 thinner and extending the pitch. Therefore, also from a viewpoint of small-sizing, preferably the IDT electrode thickness in the filter on a higher frequency side is made thicker. In order to confirm if the thickness is made thicker, the frequency estimated from the pitch and an actual frequency as the resonator are compared. An increase of the thickness can be decided in a case where the former value is higher.

Other Embodiment

In the example explained above, where there are a plurality of resonators 11 in one filter 10, the film thicknesses of the IDT electrodes 3 are not referred to in the same filter 10. However, they may be constant or may be different. That is, IDT electrodes 3 having different film thicknesses may be provided in one filter 10 as well.

For example, as shown in FIG. 1, an explanation will be given by taking as an example the case where the first filter 10a is provided with the plurality of resonators 11 (11a to 11e). The resonators 11a to 11c are series resonators which are connected in series between the terminals T1 and T2. The resonators 11d and 11e are the parallel resonators which are connected between a wiring line serially connecting the series resonators between the terminals T1 and T2, and reference potential terminals TG.

In such a ladder-type filter, designing is carried out so that the resonance frequency of the series resonator and the anti-resonance frequency of the parallel resonator substantially coincide, therefore naturally the resonance frequencies of the two resonators are different from each other. Therefore, a difference of resonance frequencies of the series resonator and the parallel resonator may be adjusted by making the film thicknesses different in addition to the pitches of the IDT electrodes 3. In this case, the thickness of the IDT electrode 3 in the series resonator having a higher resonance frequency may be increased as well.

In particular, where the pitches of the IDT electrodes 3 are made the same between the series resonator and the parallel resonator and only the film thicknesses are made different, the frequencies of bulk wave spurious emission caused in the two resonators coincide in the first filter 10a. Due to this, by only setting the pitches of the two resonators to the certain value, the bulk wave spurious emission can be easily offset from the frequency position at which a bulk wave spurious emission is not desired to be caused.

Further, in the ladder-type filter, sometimes the resonance frequencies are made different a little by a little among the plurality of series resonators or the resonance frequencies are made different a little by a little among the plurality of parallel resonators. Even in such a case, the film thicknesses may be made different among the series resonators to make the resonance frequencies different or the film thicknesses may be made different among the parallel resonators to make the resonance frequencies different.

The resonators having the different film thicknesses in the first filter as explained above are referred to as the first resonator and second resonator. The thickness of the IDT electrode 3 in the first resonator becomes thicker compared with the thickness of the IDT electrode 3 in the second resonator. The resonance frequency of the first resonator may be made higher than the resonance frequency of the second resonator as well.

In the same way as the first filter 10a, resonators having different film thicknesses may be provided also in the second filter 10b. In this case, the resonators having different film thicknesses are referred to as a third resonator and fourth resonator. The thickness of the IDT electrode 3 in the third resonator becomes thicker compared with the thickness of the IDT electrode in the fourth resonator. The resonance frequency of the third resonator may be made higher than the resonance frequency of the fourth resonator as well.

Note that, in this way, in a case where the thicknesses of the plurality of IDT electrodes 3 configuring the first filter 10a are not constant or a case where the thicknesses of the plurality of IDT electrodes 3 configuring the second filter 10b are not constant, and in a case where the two are not constant, the thickness of the IDT electrode 3 in the first filter 10a means an average of the thicknesses of the plurality of IDT electrodes 3. Same is true for the thickness of the IDT electrode 3 in the second filter 10b. Due to this, it becomes possible to compare the thickness of the IDT electrode 3 in the first filter 10a and the thickness of the IDT electrode 3 in the second filter 10b.

Other Embodiment

In the example explained above, the example in which the two of the first filter 10a and the second filter 10b were the ladder-type filters was explained. However, they may be a combination of one being a multimode type and the other being a ladder-type or the two may be the multimode type.

Further, in the example explained above, the example of adjusting the relationships between the frequency of the bulk wave spurious emission and the passband as the filter (or the resonance/anti-resonance frequency as the resonator) with the use of the thickness and pitch of the IDT electrode 3 was explained. However, the same adjustment may be carried out with the use of a duty and the pitch as well.

Further, in the example explained above, the example of individually providing the terminals in the first filter 10a and the second filter 10b was shown. However, the terminals in a portion may be shared as well. For example, a terminal connected to an antenna may be shared as well.

Further, in the example explained above, the example of sharing one piezoelectric substrate 2 by the first filter 10a and the second filter 10b was explained. However, they may be provided on different piezoelectric substrates 2 having the same thickness as well.

REFERENCE SIGNS LIST

1: acoustic wave device
2: piezoelectric substrate
10: filter
10a: first filter
10b: second filter
3: IDT electrode
32: electrode finger
32a: first electrode finger
32b: second electrode finger
6: support substrate

The invention claimed is:

1. An acoustic wave device, comprising:
a piezoelectric substrate comprising a first surface and a second surface,
a support substrate bonded to the second surface of the piezoelectric substrate, and
a first filter and a second filter having a passband of which is higher than that of the first filter, both being on the first surface of the piezoelectric substrate, wherein
the first filter and the second filter respectively comprises at least one first IDT electrode and at least one second IDT electrode, and
a thickness of the at least one first IDT electrode is thinner than a thickness of the at least one second IDT electrode.

2. The acoustic wave device according to claim 1, wherein
the at least one first IDT electrode comprises a plurality of first IDT electrodes and all of thicknesses thereof are the same, and
the at least one second IDT electrode comprises a plurality of second IDT electrodes and all of thicknesses thereof are the same.

3. The acoustic wave device according to claim 1, wherein
the first filter comprises connected a plurality of acoustic wave resonators each comprising the at least one first IDT electrode,
the plurality of acoustic wave resonators comprise a first resonator and a second resonator, and
the at least one first IDT electrode of the first resonator is thicker than that of the second resonator.

4. The acoustic wave device according to claim 1, wherein
the second filter comprises connected a plurality of acoustic wave resonators each comprising the at least one second IDT electrode,
the plurality of acoustic wave resonators comprise a third resonator and a fourth resonator, and
the at least one second IDT electrode of the third resonator is thicker than that of the fourth resonator.

5. The acoustic wave device according to claim 1, wherein
the first filter comprises connected a plurality of acoustic wave resonators each comprising the at least one first IDT electrode,
the plurality of acoustic wave resonators comprise a series resonator and a parallel resonator configuring a ladder-type filter, and
the at least one first IDT electrode of the series resonator is thicker than that of the parallel resonator.

6. The acoustic wave device according to claim 1, wherein
the piezoelectric substrate is a lithium tantalate substrate, and
the support substrate is a crystalline material having a thermal expansion coefficient of which is smaller than that of the piezoelectric substrate.

* * * * *